United States Patent
Ueda et al.

[11] Patent Number: 6,090,666
[45] Date of Patent: Jul. 18, 2000

[54] METHOD FOR FABRICATING SEMICONDUCTOR NANOCRYSTAL AND SEMICONDUCTOR MEMORY DEVICE USING THE SEMICONDUCTOR NANOCRYSTAL

[75] Inventors: Tohru Ueda; Kenta Nakamura, both of Fukuyama; Yasumori Fukushima, Sakurai, all of Japan

[73] Assignee: Sharp Kabushiki Kaisha, Osaka, Japan

[21] Appl. No.: 09/163,552

[22] Filed: Sep. 30, 1998

[30] Foreign Application Priority Data

Sep. 30, 1997 [JP] Japan ..................................... 9-266986

[51] Int. Cl.$^7$ .................................................. H01L 21/336
[52] U.S. Cl. .......................... 438/257; 438/263; 438/264; 117/935; 117/936; 117/87
[58] Field of Search ................................... 438/257, 263, 438/264; 117/935, 936, 87

[56] References Cited

U.S. PATENT DOCUMENTS

| | | |
|---|---|---|
| 5,508,543 | 4/1996 | Hartstein et al. . |
| 5,850,064 | 12/1998 | Goldstein .............................. 204/157.4 |
| 5,852,306 | 12/1998 | Forbes ..................................... 257/315 |
| 5,959,896 | 9/1999 | Forbes ................................. 365/185.33 |

OTHER PUBLICATIONS

Tiwari et al, "A Silicon Nanocrystals Based Memory", Appl. Phys. Lett. 68 (10), Mar. 4, 1996, American Institute of Physics, pp. 1377–1379.

Hanafi, et al, "Fast and Long Retention–Time Non–Crystal Memory", IEEE Transactions on Electron Devices, vol. 43, No. 9, Sep. 1996, pp. 1553–1558.

*Primary Examiner*—Richard Elms
*Assistant Examiner*—Bradley Smith
*Attorney, Agent, or Firm*—Nixon & Vanderhye, P.C.

[57] ABSTRACT

There are provided a method for fabricating semiconductor nanocrystals which are highly controllable and less variable in density and size, as well as a semiconductor memory device which, with the use of the semiconductor nanocrystals, allows thickness of a insulating film between nanocrystals and channel region to be easily controlled and involves less variations in characteristics such as threshold and programming performance, and which is fast reprogrammable and has nonvolatility. Under a low pressure below atmospheric pressure, an amorphous silicon thin film 3 is deposited on a tunnel insulating film 2 formed on a silicon substrate 1. After the deposition of the amorphous silicon thin film 3, the amorphous silicon thin film 3 is heat treated at a temperature not lower than the deposition temperature of the amorphous silicon thin film 3 in an atmosphere of helium gas having no oxidizability, by which a plurality of spherical nanocrystals 4 with a diameter of 18 nm or less are formed on the tunnel insulating film 2 so as to be spaced from one another. The plurality of nanocrystals 4 are used as the floating gate of a semiconductor memory device.

13 Claims, 6 Drawing Sheets

METHOD FOR FABRICATING SEMICONDUCTOR NANOCRYSTAL AND SEMICONDUCTOR MEMORY DEVICE USING THE SEMICONDUCTOR NANOCRYSTAL

BACKGROUND OF THE INVENTION

The present invention relates to a method for fabricating a semiconductor nanocrystal which is used as a floating gate to be used for electrically erasable and programmable nonvolatile memories and the like, and also relates to a semiconductor memory device using the semiconductor nanocrystal.

For reduction in power consumption as well as reduction in size of electronic equipment, it is considered that a semiconductor memory device (EEPROM) which is high in degree of integration, low in power consumption and electrically erasable and programmable is necessary. This semiconductor memory device having nonvolatility has a floating gate between a channel region and a gate region, this floating gate serving as a carrier confinement region. However, the semiconductor memory device generally has the following problems:

(i) In terms of reliability deterioration due to hot carriers, the number of times that electric charges are implanted to and removed from the floating gate is limited, so that the number of writing and erasing operations is limited;

(ii) A relatively thick insulating film is needed to maintain the nonvolatility, and in order to implant electrons or positive holes through this thick insulating film by Fowler-Nordheim tunnel effect, a voltage as large as 10 V or more is demanded as it stands. As a result, hot carriers are generated so that degradation of the insulating film occurs due to the formation of traps by hot carriers, reaction at the interface and the relaxation of hot carriers; and (iii) Programming and erasing operations are performed with a small current that flows through charging to and discharging from the floating gate, so that the charging and discharging time is long (on the order of milliseconds).

Under these circumstances, a semiconductor memory device that has solved these (i) to (iii) problems has been proposed in Japanese Patent Laid-Open Publication HEI 7-302848. In this semiconductor memory device, as shown in FIG. 5, a source region 108 and a drain region 110 are formed with a specified spacing in a semiconductor substrate 120, and a floating gate 104 is formed on the semiconductor substrate 120 via an insulating layer 112 in a region opposite to a channel region 106 between the source and drain regions 108, 110. Then, the floating gate 104 is covered with an insulating layer 102, and a control gate 100 is formed thereon. The floating gate 104, as shown in FIG. 6, is formed into a cluster or island 122 made of a semiconductor material having a diameter of 1 nm–20 nm. Further, the insulating layer 112 between the channel region 106 and the floating gate 104 is thinned until electrons are allowed to pass therethrough directly by the tunnel effect, while the floating gate 104 is made lower in energy level than the channel region 106, thus making it hard for trapped electrons to easily escape therefrom.

The method for fabricating the floating gate is described in the following two literatures:

(1) A silicon nanocrystals based memory, Sandip Tiwari et al., Appl. Phys. Lett. 68(10), p.1377 (1996)

FIG. 7 schematically shows a cross section of a semiconductor memory device having a floating gate described in this literature. A 1.1 nm–1.8 nm thick tunnel insulating film 202 is formed on a semiconductor substrate 201 having a source region 206 and a drain region 207 formed therein, and nanocrystals 203 with diameter 5 nm and spacing 5 nm are formed on the tunnel insulating film 202 with CVD (Chemical Vapour Deposition) equipment. The density of the nanocrystals 203 is $1 \times 10^{12}$ cm$^{-2}$. Further, a control gate insulating film 204 is formed on the nanocrystals 203, and 7 nm thick $SiO_2$ is deposited on the control gate insulating film 204, by which a control gate 205 is formed.

(2) Fast and Long Retention-Time Nano-Crystal Memory, Hussein I. Hanafi et al., IEEE Trans. Electron Device, Vol. 43, p.1379 (1996)

FIGS. 8A to 8C show a method for fabricating a semiconductor memory device having a floating gate as described in this literature. A 5 nm–20 nm thermal oxide film 302 is formed on a semiconductor substrate 301 (shown in FIG. 8A), and high-dose silicon Si or germanium Ge is ion-implanted to an oversaturation into the thermal oxide film 302 (shown in FIG. 8B). The ion implantation in this case is carried out under conditions of, for example, 5 keV and $5 \times 10^{15}$ cm$^{-2}$. After that, in a nitrogen $N_2$ atmosphere, heat treatment at 950° C. for 30 minutes is carried out, by which 5 nm-diameter nanocrystals 303 of silicon Si or germanium Ge are grown in the thermal oxide film 302.

Then, a source region 305 and a drain region 306 are formed in the semiconductor substrate 301 with a specified spacing, and a gate electrode 304 is formed on the thermal oxide film 302 at a region opposite to the region between the source region 305 and the drain region 306 (shown in FIG. 8C).

As described in the above literatures (1) and (2), a shift voltage $\Delta Vth$ of a threshold voltage $Vth$ which results when one electron is stored per nanocrystal can be expressed by the following equation:

$$\Delta Vth = q(n_{well}/\epsilon_{ox})(t_{cntl} + (\epsilon_{ox}/\epsilon_{si})t_{well}/2) \qquad (Eq. 1)$$

where q is the charge of the electron;

$n_{well}$ is the nanocrystal density;

$\epsilon_{ox}$ is the dielectric constant of the oxide film;

$t_{cntl}$ is the thickness of the control gate oxide film;

$\epsilon_{si}$ is the dielectric constant of silicon; and $t_{well}$ is the size of nanocrystal.

As apparent from Equation 1, it can be understood that variations in the device characteristic ($\Delta Vth$) can be reduced by reducing variations in the nanocrystal density $n_{well}$ and the size of nanocrystals $t_{well}$. Also, since the thickness of the tunnel insulating film between the nanocrystals and the channel determinatively conditions the direct tunneling of electrons to the nanocrystals (the tunneling probability is expressed by a function of the thickness of the tunnel insulating film), variations in this film thickness affects variations in the programming characteristics. Thus, the nanocrystal density, the size of nanocrystals and the thickness of the tunnel insulating film between the nanocrystals and the channel can be considered as principal parameters inherent in memory which are to be controlled.

Now the nanocrystal density, the size of nanocrystals and the thickness of the tunnel insulating film between nanocrystals and channel in the aforementioned literatures (1) and (2) are discussed. On Literature (1):

The semiconductor memory device of Literature (1) can be regarded as one that utilizes nanocrystals which happen to be present on the surface of the ground $SiO_2$ film or which are grown in island-like form around random crystal nuclei generated in the initial stage of CVD process, in which case neither the nanocrystal density nor the size of nanocrystals is controlled. As to the thickness of the tunnel insulating film between nanocrystals and channel, because the semiconductor substrate is thermally oxidized in advance, it can be considered that the film thickness can be controlled by the prior art technique. On Literature (2):

In the semiconductor memory device of Literature (2), silicon Si or germanium Ge is ion-implanted into the thermal oxide film 302 and then heat treated, so that nanocrystals are grown in the thermal oxide film 302. In this case, the implanted ion concentration is distributed depthwise, so that the ion concentration in the thermal oxide film 302 cannot be made uniform. Accordingly, because the heat treatment is carried out with variations in concentration distribution, the depthwise nanocrystal density in the thermal oxide film 302 also has a distribution, where it can be considered difficult to control the nanocrystal density, the size of nanocrystals and the thickness of the tunnel insulating film between nanocrystals and channel. That is, it is difficult to improve the controllability and uniformity of the nanocrystal density, the size of nanocrystals and the thickness of the tunnel insulating film between nanocrystals and channel, which are the issues to be solved.

Further, to achieve an ion implantation into an extremely thin oxide film with film thickness 5 nm–20 nm while preventing the ions from reaching the ground semiconductor substrate, there is a need of performing an implantation of ions of as low energy as possible, which is exemplified by 5 keV for a 20 nm oxide film. Besides, the energy needs to be reduced for thinner thicknesses of the oxide film, in which case it could become hard to control the implantation of such low-energy ions with ordinary performance of ion implantation equipment, hence impractical as a fabrication method.

An object of the present invention is therefore to provide a method for fabricating semiconductor nanocrystals capable of forming semiconductor nanocrystals which are highly controllable and less variable in density and size.

Another object of the present invention is to provide a semiconductor memory device which, with the use of the semiconductor nanocrystals for the semiconductor memory device, allows the thickness of the insulating film between semiconductor nanocrystals and channel region to be easily controlled, involves smaller variations in characteristics such as threshold voltage and writing performance, and which is fast reprogrammable and has nonvolatility.

In order to achieve the above object, the present invention provides a method for fabricating semiconductor nanocrystals comprising:

a step for depositing a noncrystal semiconductor thin film on a semiconductor substrate, or on an insulating film formed on the semiconductor substrate, under a low pressure below atmospheric pressure; and a step for, after the deposition of the noncrystal semiconductor thin film, heat treating the noncrystal semiconductor thin film at a temperature not lower than a deposition temperature of the noncrystal semiconductor thin film in a vacuum or in an atmosphere of a gas having no oxidizability, by which a plurality of spherical semiconductor nanocrystals with a diameter of 18 nm or less are formed on the semiconductor substrate or on the insulating film so as to be spaced from one another.

According to the method for fabricating semiconductor nanocrystals of the present invention, after the noncrystal semiconductor thin film is deposited on the semiconductor substrate or on an insulating film formed on the semiconductor substrate under the low pressure below atmospheric pressure, and then the deposited noncrystal semiconductor thin film is subjected to heat treatment in a vacuum or in a gas atmosphere having no oxidizability at a temperature higher than the deposition temperature of the noncrystal semiconductor thin film so as to be all changed into crystal grains, by which a plurality of spherical semiconductor nanocrystals are formed. In this process, the deposition thickness "t" of the noncrystal semiconductor thin film, the radius "$r_0$" of the nanocrystals and the center distance "s" of adjacent crystal grains are in the relation that $$s^2 t = (4\pi/3) r_0^3 \qquad \text{(Eq. 2)}$$

The center distance "s" between adjacent semiconductor nanocrystals is equivalent to the density of the semiconductor nanocrystals and determined by the thickness of the noncrystal semiconductor thin film and the conditions of the heat treatment. Accordingly, by controlling the center distance "s" of adjacent semiconductor nanocrystals and the deposition thickness "t" by the medium of the quality of the noncrystal semiconductor thin film and the conditions of the heat treatment, the density and size of the semiconductor nanocrystals can be controlled. Also, with the diameter of the semiconductor nanocrystals made to be less than 18 nm, the lowest energy of the spherical semiconductor nanocrystals becomes larger than the energy at room temperature, so that the semiconductor nanocrystals as a carrier confinement region can retain electrons for enough long time at room temperature without being affected by thermal fluctuation. Thus, semiconductor nanocrystals which are good at controllability of density and size, and smaller in characteristic variations can be formed. Besides, with the use of the semiconductor nanocrystals for a semiconductor memory device, a semiconductor memory device which allows the thickness of the insulating film between semiconductor nanocrystals and channel region to be easily controlled, involves smaller variations in characteristics such as threshold voltage and programming performance, and which is fast reprogrammable and has nonvolatility can be realized.

In one embodiment, after the deposition of the noncrystal semiconductor thin film, the semiconductor nanocrystals are formed without exposing the noncrystal semiconductor thin film to the air.

According to the method for fabricating semiconductor nanocrystals of this embodiment, after the noncrystal semiconductor thin film is deposited, semiconductor nanocrystals are formed in the absence of any natural oxide film without exposing the noncrystal semiconductor thin film to the air. Because no natural oxide film that blocks the crystal growth is present in the surface under crystallization, the semiconductor nanocrystals crystallize while the surface shape is changing with ease, thus resulting in a shape close to a sphere, which is the most stable shape.

Also, one embodiment comprises a step for, after the deposition of the noncrystal semiconductor thin film, removing an oxide film from a surface of the noncrystal semiconductor thin film at a temperature not higher than the deposition temperature of the noncrystal semiconductor thin film before forming the semiconductor nanocrystals.

According to the method for fabricating semiconductor nanocrystals of this embodiment, even once the substrate is exposed to the air after the deposition of the noncrystal semiconductor thin film, the natural oxide film at the surface is, for example, removed by sputtering with Ar plasma under a pressure below atmospheric pressure or deoxidized and removed in an atmosphere of silane gas or the like under a high vacuum, and then the heat treatment for forming semiconductor nanocrystals is carried out. Thus, the semiconductor nanocrystals crystallize while the surface shape is changing with ease, so that the semiconductor nanocrystals result in a shape close to a sphere, the most stable shape.

Also, one embodiment further comprises a step for, after the deposition of the noncrystal semiconductor thin film, forming crystal nuclei at the surface of the noncrystal semiconductor thin film at a low pressure below atmospheric pressure before forming the semiconductor nanocrystals.

According to the method for fabricating semiconductor nanocrystals of this embodiment, after the noncrystal semiconductor thin film is deposited on the semiconductor substrate or on the insulating film formed on the semiconductor substrate, the crystal nuclei are formed at the surface of the noncrystal semiconductor thin film, and subsequently the semiconductor nanocrystals are grown with the seeds of the crystal nuclei at the surface of the noncrystal semiconductor thin film by heat treatment under a low pressure below atmospheric pressure. Therefore, the controllability for the size, shape, crystallinity and the like of the semiconductor nanocrystals is enhanced so that variations in those characteristics can be further reduced. In this case, the density of crystal nuclei can be determined depending on the conditions under which the crystal nuclei are formed.

Also, in one embodiment, the semiconductor nanocrystals are made from silicon; and the step for forming the crystal nuclei is carried out in a 0.01 Torr or lower vacuum by using a gas containing any one of silane gas, disilane gas or trisilane gas as a material gas.

According to the method for fabricating semiconductor nanocrystals of this embodiment, after the noncrystal semiconductor thin film is deposited, the substrate is placed in the reaction chamber and treated, while being heated, with the flow of the gas containing any one of silane gas, disilane gas or trisilane gas under a low pressure of 0.01 Torr or lower. Thus, molecules or reaction seeds of the gas are adsorbed to the surface of the noncrystal semiconductor thin film, by which crystal nuclei optimum for the formation of semiconductor nanocrystals can be easily formed without causing the formation of island-like silicon grains. The density of the crystal nuclei can be determined by the temperature and time at and for which the gas containing any one of silane gas, disilane gas or trisilane gas is kept flowing, hence high controllability.

Also, in one embodiment, the semiconductor nanocrystals are made from germanium; and the step for forming the crystal nuclei is carried out in a 0.01 Torr or lower vacuum by using a gas containing either one of germanium tetrafluoride or monogermane as a material gas.

According to the method for fabricating semiconductor nanocrystals of this embodiment, after the noncrystal semiconductor thin film is deposited, the substrate is placed in the reaction chamber and treated, while being heated, with the flow of the gas containing either one of germanium tetrafluoride or monogermane under a low pressure of 0.01 Torr or lower. Thus, molecules or reaction seeds of the gas are adsorbed to the surface of the noncrystal semiconductor thin film, by which crystal nuclei optimum for the formation of semiconductor nanocrystals made from germanium can be easily formed without causing the formation of island-like germanium grains. The density of the crystal nuclei can be determined by the temperature and time at and for which the gas containing either one of germanium tetrafluoride or monogermane is kept flowing, hence high controllability.

Also, in one embodiment, the semiconductor nanocrystals are made from silicon and germanium; and the step for forming the crystal nuclei is carried out in a 0.01 Torr or lower vacuum by using a gas containing any one of silane gas, disilane gas or trisilane gas and either one of germanium tetrafluoride or monogermane as a material gas.

According to the method for fabricating semiconductor nanocrystals of this embodiment, with the flow of a gas containing any one of silane gas, disilane gas or trisilane gas and either one of germanium tetrafluoride or monogermane, treatment is carried out under a low pressure of 0.01 Torr or lower. Thus, molecules or reaction seeds of the gas are adsorbed to the surface of the noncrystal semiconductor thin film, by which crystal nuclei optimum for the formation of semiconductor nanocrystals made from silicon and germanium can be easily formed without causing the formation of island-like silicon-germanium grains. The density of the crystal nuclei can be determined by the temperature and time at and for which the gas containing any one of silane gas, disilane gas or trisilane gas and either one of germanium tetrafluoride or monogermane is kept flowing, hence high controllability.

Also, one embodiment further comprises a step for, after the noncrystal semiconductor thin film is deposited on the semiconductor substrate and the semiconductor nanocrystals are formed, oxidizing the surface of the semiconductor nanocrystals and the surface of the semiconductor substrate, thereby forming an oxide film.

According to the method for fabricating semiconductor nanocrystals of this embodiment, with these semiconductor nanocrystals applied to a semiconductor memory device, after the semiconductor nanocrystals are formed on the semiconductor substrate, the surface of the semiconductor nanocrystals and the surface of the semiconductor substrate are oxidized. Thus, the oxide film which results in a tunnel insulating film between channel region and semiconductor nanocrystals of the semiconductor memory device can be formed with good controllability.

Also, in one embodiment, a deposition thickness "t" of the noncrystal semiconductor thin film and a center distance "s" of adjacent semiconductor nanocrystals satisfy a relationship that $t < (\pi/6)s$.

According to the method for fabricating semiconductor nanocrystals of this embodiment, the deposition thickness "t" and the center distance "s" of semiconductor nanocrystals are set so as to satisfy the relational expression between the deposition thickness "t" and the center distance "s" of the semiconductor nanocrystals. As a result, semiconductor nanocrystals can be formed with spacings between adjacent semiconductor nanocrystals, without causing the adjacent semiconductor nanocrystals to make contact with each other.

Also, in one embodiment, the semiconductor nanocrystals are made from any one of silicon, germanium or a mixture of silicon and germanium.

According to the method for fabricating semiconductor nanocrystals of this embodiment, semiconductor nanocrystals made from any one of silicon, germanium or a mixture of silicon and germanium can be easily formed by existing fabrication equipment and process control. Moreover, semiconductor nanocrystals which are highly controllable and less variable in the size, shape, crystallinity and the like of the semiconductor nanocrystals can be easily formed.

Also, in one embodiment, the semiconductor nanocrystals are made from silicon;

in the step for forming the noncrystal semiconductor thin film, an amorphous silicon thin film is deposited by using any one of silane gas, disilane gas or trisilane gas as a material gas, or by using a mixed gas of any one of silane gas, disilane gas or trisilane gas and a as having no oxidizability as a material gas; and in the step for forming the semiconductor nanocrystals, the semiconductor nanocrystals are grown in a 10 Torr or lower vacuum or in a 10 Torr or lower atmosphere of a gas having no oxidizability.

According to the method for fabricating semiconductor nanocrystals of this embodiment, by using any one of silane gas, disilane gas or trisilane gas as the material gas, or by using a mixed gas of any one of silane gas, disilane gas or trisilane gas and a gas having no oxidizability such as helium, nitrogen, argon or hydrogen as the material gas, reaction is made in a vacuum below atmospheric pressure so that a noncrystal semiconductor thin film is deposited, and subsequently heat treatment is carried out at a temperature higher than the deposition temperature of the noncrystal semiconductor thin film in a 10 Torr or lower vacuum or in a 10 Torr or lower atmosphere of a gas having no oxidizability such as helium, nitrogen, argon and hydrogen. Thus, spherical semiconductor nanocrystals uniform in size and shape can be formed.

Also, in one embodiment, the semiconductor nanocrystals are made from germanium;

in the step for forming the noncrystal semiconductor thin film, an amorphous germanium thin film is deposited by using any one of germanium tetrafluoride or monogermane as a material gas, or by using a mixed gas of either one of germanium tetrafluoride or monogermane and a gas having no oxidizability as a material gas; and in the step for forming the semiconductor nanocrystals, the semiconductor nanocrystals are grown in a 10 Torr or lower vacuum or in a 10 Torr or lower atmosphere of a gas having no oxidizability.

According to the method for fabricating semiconductor nanocrystals of this embodiment, by using any one of germanium tetrafluoride or monogermane as the material gas, or by using a mixed gas of either one of germanium tetrafluoride or monogermane and a gas having no oxidizability such as helium, nitrogen, argon or hydrogen as the material gas, reaction is made in a vacuum below atmospheric pressure, and subsequently heat treatment is carried out at a temperature higher than the deposition temperature of the noncrystal semiconductor thin film in a vacuum with a pressure of 10 Torr or lower or in a 10 Torr or lower atmosphere of a gas having no oxidizability such as helium, nitrogen, argon and hydrogen. Thus, spherical semiconductor nanocrystals uniform in size and shape can be formed.

Also, in one embodiment, the semiconductor nanocrystals are made from silicon and germanium;

in the step for forming the noncrystal semiconductor thin film, an amorphous silicon-germanium thin film is deposited by using any one of silane gas, disilane gas or trisilane gas and either one of germanium tetrafluoride or monogermane as a material gas, or by using a mixed gas of any one of silane gas, disilane gas or trisilane gas, either one of germanium tetrafluoride or monogermane and a gas having no oxidizability as a material gas; and in the step for forming the semiconductor nanocrystals, the semiconductor nanocrystals are grown in a 10 Torr or lower vacuum or in a 10 Torr or lower atmosphere of a gas having no oxidizability.

According to the method for fabricating semiconductor nanocrystals of this embodiment, by using any one of silane gas, disilane gas or trisilane gas and either one of germanium tetrafluoride or monogermane as the material gas, or by using a mixed gas of any one of silane gas, disilane gas or trisilane gas and either one of germanium tetrafluoride or monogermane and a gas having no oxidizability such as helium, nitrogen, argon or hydrogen as the material gas, reaction is made in a vacuum below atmospheric pressure so that a noncrystal semiconductor thin film is deposited, and subsequently heat treatment is carried out at a temperature higher than the deposition temperature of the noncrystal semiconductor thin film in a vacuum with a pressure of 10 Torr or lower or in a 10 Torr or lower atmosphere of a gas having no oxidizability such as helium, nitrogen, argon and hydrogen. Thus, spherical semiconductor nanocrystals uniform in size and shape can be formed.

Also, one embodiment provides a semiconductor memory device using semiconductor nanocrystals, wherein the semiconductor nanocrystals fabricated by any one of the methods for fabricating semiconductor nanocrystals as defined above are used as a floating gate of a transistor formed on an SOI substrate.

According to the semiconductor memory device using the semiconductor nanocrystals of this embodiment, the semiconductor nanocrystals are used as a floating gate serving as a carrier confinement region of the transistor formed on the SOI substrate. Thus, a fast reprogrammable, nonvolatile semiconductor memory device which can be implemented with smaller numbers of elements and smaller area and which is smaller in variations can be realized.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, a method for fabricating semiconductor nanocrystals according to the present invention and a semiconductor memory device using the semiconductor nanocrystals are described in detail by embodiments illustrated in the accompanying drawings.

(First Embodiment)

FIGS. 1A, 1B, 1C, 1D and 1E are views showing the fabricating process of a semiconductor memory device using is the method for fabricating semiconductor nanocrystals according to the first embodiment of the present invention.

Figure 1A:
FIGS. 1A, 1B, 1C, 1D and 1E are views showing fabricating process of a semiconductor memory device using a method for fabricating semiconductor nanocrystals according to a first embodiment of the present invention.
Figure 1B:
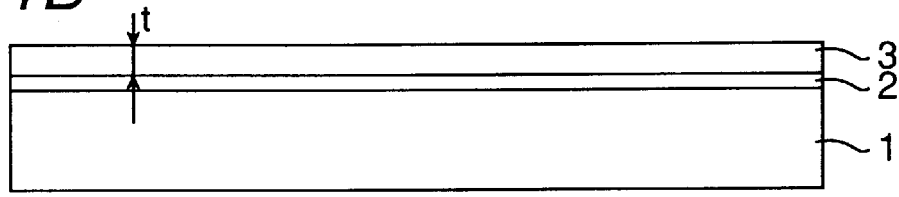

First, as shown in FIG. 1A, a surface of a silicon substrate 1 is oxidized by RTO (Rapid Thermal Oxidation) under the following conditions, so that a 2 nm thick tunnel insulating film 2 is formed on the silicon substrate 1 surface.

Mixed gas of $N_2O$ and $O_2$: $N_2O/(N_2O+O_2)=65\%$

Temperature: 1050° C.

Next, by using unshown furnace-type hot-wall LP (Low Pressure) CVD (Chemical Vapor Deposition) equipment, a deposition process (shown in FIG. 1B) for depositing an amorphous silicon thin film 3 on the tunnel insulating film 2 within the same equipment and further a heat treatment process (shown in FIGS. 1C, 1D) for spherical crystallization are carried out continuously under the following conditions while a vacuum-state is maintained: (Process for deposition of amorphous silicon thin film)

Temperature: 500° C.

Material gas: monosilane, 50 sccm

Dilution gas: helium, 1000 sccm

Pressure: 25 Pa

Deposition rate: 2 Å/min

Film thickness: 4 nm (Heat treatment process)

Temperature: 750° C.

Atmospheric gas: helium

Pressure: 0.01 Torr

Figure 1C:
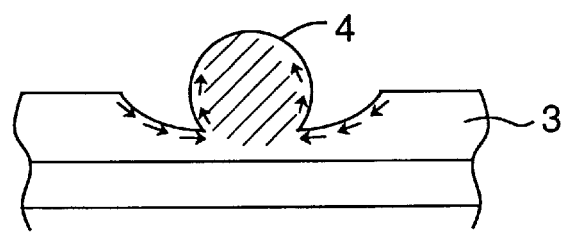
Figure 1D:
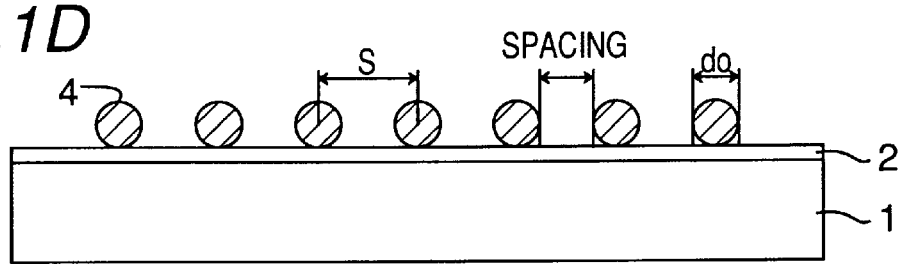

Under these conditions, as shown in FIG. 1D, nanocrystals 4 having a diameter $d_0$ of 8 nm, a spacing of 6 nm and a center distance "s" of 14 nm or so were obtained.

The material gas for the "process for deposition of amorphous silicon thin film" may be disilane gas or trisilane gas in place of monosilane. The monosilane gas, the disilane gas and the trisilane gas have decomposing temperatures decreasing in this order, so that the deposition temperature can be lowered in this order, where an amorphous silicon thin film can be deposited in temperature ranges of 500–550° C., 450–500° C. and 400–450° C., respectively. Generally, the thin film, when getting very thin to 10 nm or less, becomes likely to form an island shape just after the deposition. In order to obtain a continuous thin film as required this time, it is desirable that the thin film is deposited at lower temperatures.

Also, the dilution gas may be a gas having no oxidizability such as nitrogen, hydrogen and argon in place of helium. Though the dilution gas does not necessarily need to be used, using the dilution gas makes it easier to control the uniformity of film thickness.

Further, the temperature in the "heat treatment process" needs to be higher than the deposition temperature of amorphous silicon thin film so as to allow the crystallization to progress. Desirably, the temperature is 600° C. or higher at which the crystallization easily progresses. Generally, the higher the temperature, the higher the density of crystal nuclei generated in the initial stage of this heat treatment, and so the temperature was set to 750° C. in this first embodiment.

Also, 10 Torr or higher pressures would cause some faults that nanocrystals are formed nonspherical or that nanocrystals have variations in size, thus unfavorable. Generally, to obtain a desired nanocrystal, it is necessary to set a temperature suitable for the film quality of the deposited amorphous silicon thin film. Further, by using a small quantity of a gas having no oxidizability as the atmospheric gas in the heat treatment, it becomes easier to obtain more uniform nanocrystals over the entire substrate surface. In addition, for equipment provided with a CVD reaction chamber that allows the substrate to be transferred via a load lock chamber in a vacuum and an annealing lamp or heat treatment furnace, it is allowed to carry out the process for deposition of amorphous silicon thin film and the heat treatment process in separate chambers.

Figure 1E:
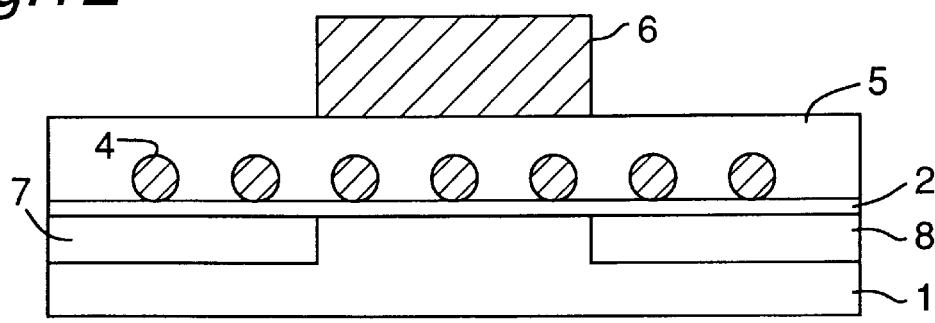

Next, as shown in FIG. 1E, an about 7 nm thick $SiO_2$ film is deposited by CVD process so that a control gate insulating film 5 is formed, and subsequently a polysilicon region which results in a gate electrode 6 is made. N-type impurities are doped into this polysilicon region at high concentration, thus making the region low resistance. Afterwards, source and drain regions 7, 8 are formed in the silicon substrate 1.

In this method for fabricating semiconductor nanocrystals, by controlling the film quality of the amorphous silicon thin film 3, the center distance "s" of adjacent nanocrystals controlled by the heat treatment conditions and the deposition film thickness "t", the density and size of the nanocrystals can be controlled. Also, the diameter of the nanocrystals 4 is made to be less than 18 nm, by which the lowest energy of the spherical nanocrystals 4 becomes larger than the energy at room temperature, so that the nanocrystals 4 as a carrier confinement region are enabled to retain electrons for enough long time at room temperature without being affected by thermal fluctuation.

The reason that the diameter of the nanocrystals 4 is made to be less than 18 nm is explained below.

First, assuming that the spherical nanocrystal is a sphere having a radius $r_0$, the ground-state energy E within the nanocrystal can be expressed based on the general quantum mechanics as follows:

$$E = h^2/(8m) \times (1/r_0^2) \qquad \text{(Eq. 3)}$$

(where h is Planck's constant and m is the effective mass of electrons).

In order that this nanocrystal acts as a carrier confinement region without being affected by thermal fluctuation, it is necessary that the ground-state energy E be larger than the energy fluctuation kT. For this purpose, the following inequality should be satisfied:

$$E > kT \qquad \text{(Eq. 4)}$$

(where k is Boltzman's constant and T is the temperature). By the above Equations 3 and 4, for the nanocrystal to be effective as a carrier confinement region at room temperature, the diameter $d_0$ of the nanocrystal needs to satisfy that $$d_0 = 2r_0 \leq 2h/[8mkT]^{1/2} \approx 18 \text{ nm} \qquad \text{(Eq. 4)}.$$

Further, assuming that one nanocrystal is a carrier confinement region surrounded by a potential barrier (the level of which is about 3.2 eV when the nanocrystal is Si and the insulating film is $SiO_2$) present at the boundary between the nanocrystal and the peripheral insulating film, and that one electron has been stored in one nanocrystal, in order that the effect of blocking another electron from entering into the nanocrystal (Coulomb blockade) is developed at room temperature, it is required that an increase in the electrostatic energy, $q^2/(2C)$, which results from the storage of one electron be larger than the thermal fluctuation energy kT, where the relationship can be expressed by the following equations:

$$q^2/(2C) > kT \quad \text{(Eq. 5)}$$

$$C = 4\pi\epsilon_i d^0 \quad \text{(Eq. 6)}$$

Where q is the charge of one electron;

k is Boltzman's constant;

T is the temperature (room temperature);

C is the self capacity of the nanocrystal;

$\epsilon_i$ is the dielectric constant of peripheral insulating film. Substituting Equation 6 into Equation 5 yields $$q^2/2/(\pi\epsilon d_0) > kT$$

$$d_0 < q^2/8\pi\epsilon_i/kT \quad \text{(Eq. 7)}$$

In order to satisfy Equation 7 at room temperature, the diameter $d_0$ of the nanocrystal is $$d_0 \leq 18 \text{ nm}.$$

Thus, in order that the energy within the nanocrystal is quantized, that its ground-state energy is higher than the fluctuation at room temperature and that the coulomb blockade is developed, it is necessary for the size of the nanocrystal that the diameter be smaller than 18 nm.

Accordingly, this method for fabricating semiconductor nanocrystals is capable of forming nanocrystals which are good at controllability and less variable in density and size. Further, when these nanocrystals are used for a semiconductor memory device, a semiconductor memory device which allows the thickness of the insulating film between nanocrystals and channel region to be easily controlled, involves smaller variations in characteristics such as threshold voltage and programming performance, and which is fast reprogrammable and has nonvolatility can be realized.

Further, when the nanocrystals 4 are formed in the absence of any natural oxide film after the deposition of the amorphous silicon thin film 3 and without exposing the thin film to the air, the nanocrystals 4 crystallize while the surface shape is changing with ease as shown in FIG. 1C because no natural oxide film that blocks the growth of the crystal growth is present on the surface under the crystallization, thus resulting in a shape close to a sphere, which is the most stable shape.

After the deposition of the amorphous silicon thin film 3, if a natural oxide film is generated on the surface with the substrate once exposed to the air, the natural oxide film on the surface is removed by the following process and subsequently heat treatment for crystallization is continuously carried out without exposing the substrate to the air and therefore without generating a natural oxide film on the surface, by which the nanocrystals 4 crystallize while the surface shape is changing, resulting in a shape close to a sphere, the most stable shape, as shown in FIG. 1C. Thus, an equivalent nanocrystal can be obtained. That is, continuous treatment is performed by using so-called multi-chamber type equipment having a reaction chamber and a heat treatment unit and designed to remove the natural oxide film via a load lock chamber that allows the substrate to be transferred in a vacuum. Also, the natural oxide film may be either removed by etching in a vapor atmosphere of hydrofluoric acid HF, or removed in Ar plasma by sputtering.

Also, by setting the deposition thickness "t" of the amorphous silicon thin film 3 and the center distance "s" of adjacent nanocrystals 4 so that their relational expression, $t < (\pi/6)s$, is satisfied, the nanocrystals 4 can be formed so as to be spaced from one another without causing adjacent nanocrystals 4 to make contact with each other.

The nanocrystals 4, which are made from silicon, can be easily formed by existing fabrication equipment and process control. Besides, nanocrystals which are highly controllable and less variable in size, shape, crystallinity and the like of the nanocrystals can be easily formed.

Also, the mixed gas of monosilane gas and helium gas having no oxidizability, which is used as the material gas, is put into reaction in a vacuum below atmospheric pressure so that the amorphous silicon thin film 3 is deposited. Subsequently, heat treatment is carried out at a temperature (e.g. 750° C.) not lower than 500° C. which is the deposition temperature of the amorphous silicon thin film 3, in a 10 Torr or lower atmosphere of helium gas having no oxidizability. As a result, spherical nanocrystals 4 uniform in size and shape can be formed.

Figure 2A:
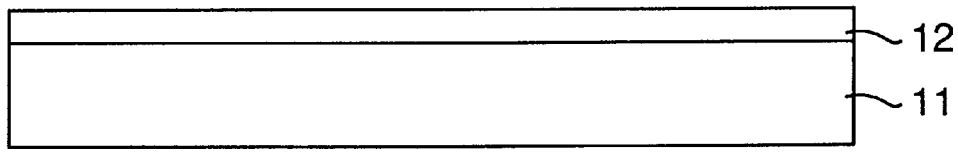
FIGS. 2A, 2B, 2C and 2D are process views in a case where semiconductor nanocrystals are formed on a silicon substrate in the method for fabricating the semiconductor nanocrystals.
Figure 2B:
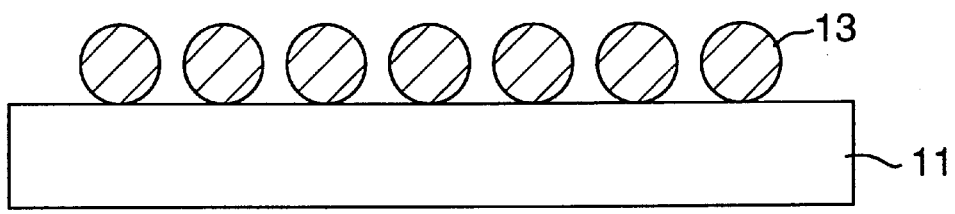
Figure 2C:
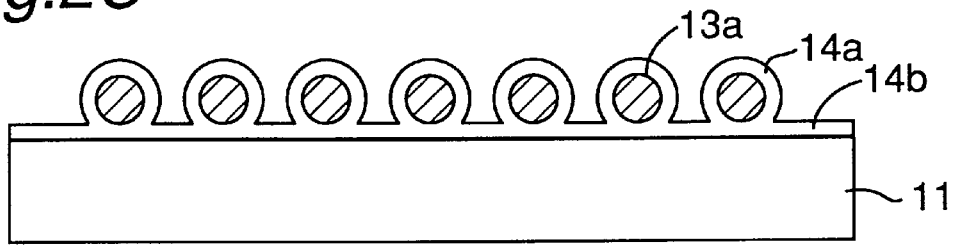
Figure 2D:
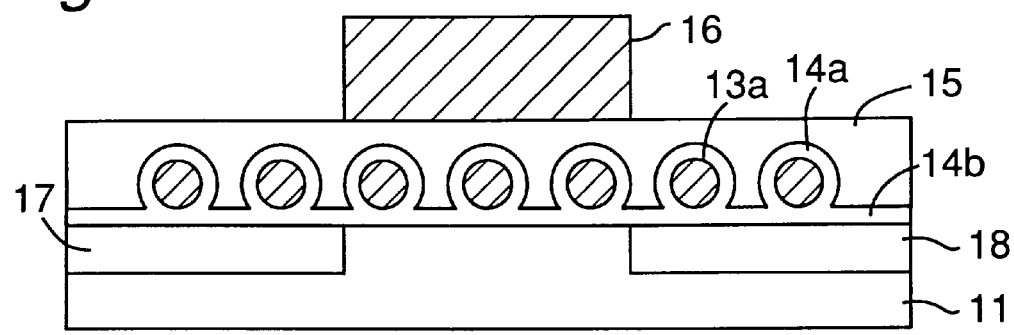

In the method for fabricating semiconductor nanocrystals of this first embodiment, the nanocrystals 4 are formed after the formation of the tunnel insulating film 2. However, this sequence may be reversed. That is, an amorphous silicon thin film 12 is formed on a silicon substrate 11 by the same process for deposition of amorphous silicon thin film as in the above fabrication process as shown in FIG. 2A, and 10 nm nanocrystals 13 are formed by the heat treatment process as shown in FIG. 2B. Subsequently, as shown in FIG. 2C, the surface of the nanocrystals 13 is oxidized to an thickness of about 2 nm while the surface of the silicon substrate 11 is oxidized so as to form a tunnel insulating film 14b. Thus, the diameter of a nanocrystal 13a the surface of which has been oxidized results in about 8 nm. Then, as shown in FIG. 2D, an about 7 nm thick SiO$_2$ film is deposited by CVD process on an oxide film 14a of the nanocrystal 13a surface and the tunnel insulating film 14b, by which a control gate insulating film 15 is formed. Subsequently, a polysilicon region which results in a gate electrode 16 is formed. N-type impurities are doped to high concentration in this polysilicon region, making the region low resistance.

After that, source and drain regions 17, 18 are formed on the silicon substrate 11. Thus, after the nanocrystals 13 are formed on the semiconductor substrate 11, the insulating films 14a, 14b are formed by oxidizing the surface of the nanocrystals 13 and the surface of the semiconductor substrate 11, by which the oxide film which results in a tunnel insulating film between the channel region, which is formed between the source and drain regions 17, 18, and the nanocrystals 13 can be formed with high controllability.

Also, the above first embodiment has been described on nanocrystals of silicon Si. However, nanocrystals of germanium Ge can also be formed similarly by deposition process and heat treatment process for forming an amorphous germanium thin film as a noncrystalline semiconductor thin film, and nanocrystals which are highly controllable and less variable in size, shape, crystallinity and the like of the nanocrystals can be easily formed.

This amorphous germanium thin film is deposited by LPCVD equipment under the following conditions:

Material gas: germanium tetrafluoride GeF$_4$

Temperature: 350° C.

Pressure: 25 Pa

In addition, monogermane GeH$_4$ may be used as the material gas.

Further, nanocrystals made from silicon Si and germanium Ge can also be formed similarly by deposition process and heat treatment process for forming an amorphous silicon-germanium thin film as a noncrystalline semiconductor thin film, and nanocrystals which are highly controllable and less variable in size, shape, crystallinity and the like of the nanocrystals can be easily formed.

The amorphous silicon-germanium thin film is deposited with LPCVD equipment under the following conditions:

Material gas: germanium tetrafluoride $GeF_4$ and disilane $Si_2H_6$

Temperature: 375° C.

Pressure: 25 Pa

In addition, as the material gas, monogermane $GeH_4$ may be used instead of the germanium tetrafluoride $GeF_4$ and silane or trisilane may be used instead of $Si_2H_6$.

Figure 3:
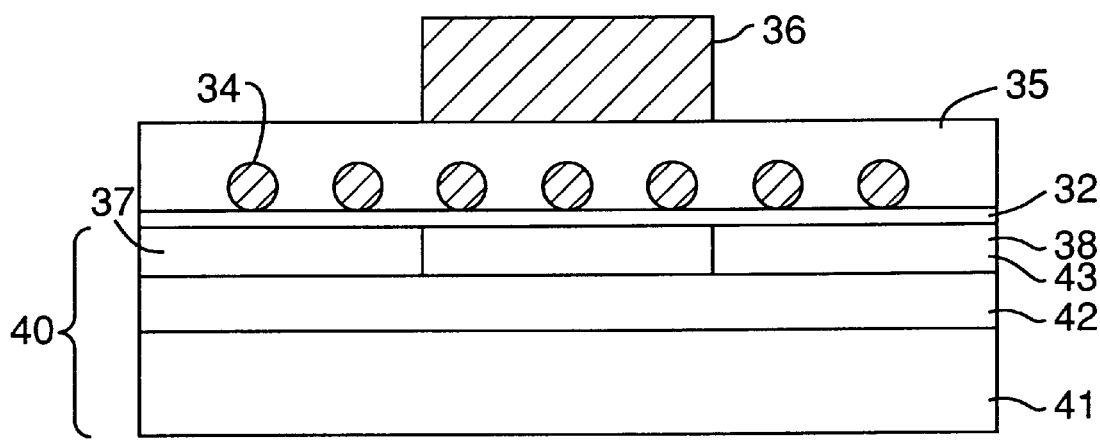
FIG. 3 is a sectional view in a case where semiconductor nanocrystals are formed on an SOI substrate in the method for fabricating the semiconductor nanocrystals.

Also, while a silicon substrate has been used in the first embodiment, an SOI (Semiconductor on Insulator) substrate 40 such as an SIMOX (Separation by Implanted Oxygen) may be used as shown in FIG. 3. As shown in FIG. 3, a tunnel insulating film 32 is formed on the SOI substrate 40 comprising a semiconductor substrate 41, a buried oxide layer 42 and a semiconductor layer 43, and spherical nanocrystals 34 are formed with spacings from one another on the tunnel insulating film 32. Then, a control gate insulating film 35 is formed on the nanocrystals 34 and the tunnel insulating film 32, and a gate electrode 36 is formed at a region opposite to the region formed between a source region 37 and a drain region 38 formed on the semiconductor layer 43 on the control gate insulating film 35. By using the nanocrystals 34 for the floating gate as a carrier confinement region of the transistor formed on the SOI substrate 40, a fast reprogrammable, nonvolatile semiconductor memory device which can be implemented with smaller numbers of elements and smaller area and which is smaller in characteristic variations can be realized.

(Second Embodiment)

FIGS. 4A to 4F are views showing process for fabricating a semiconductor memory device using the method for fabricating semiconductor nanocrystals according to a second embodiment of the present invention. This second embodiment is similar to the first embodiment except that crystal nuclei are formed.

Figure 4A:
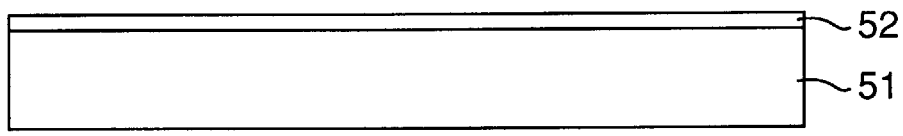
FIGS. 4A, 4B, 4C, 4D, 4E and 4F are views showing fabricating process of a semiconductor memory device using a method for fabricating semiconductor nanocrystals according to a second embodiment of the present invention.

First, as shown in FIG. 4A, a tunnel insulating film 52 is formed on a silicon substrate 51 by the same process as in the first embodiment.

Figure 4B:
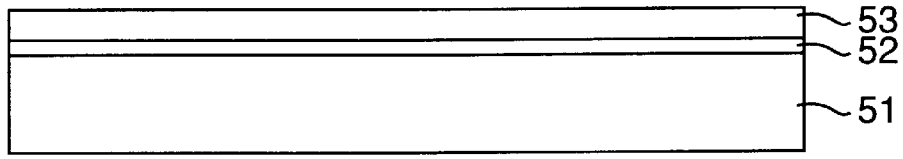
Figure 4C:
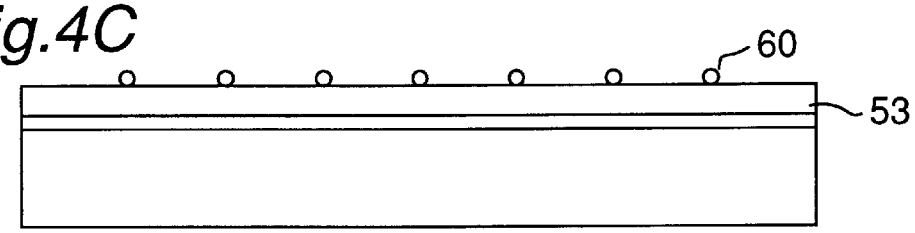
Figure 4D:
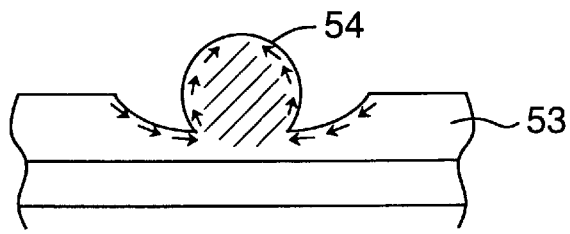

Next, as shown in FIG. 4B, a 4 nm thick amorphous silicon thin film 53 is deposited by the same process as in the first embodiment.

Next, a process for forming crystal nuclei 60 onto the surface of the amorphous silicon thin film 53 within the same LPCVD equipment (not shown) as in the first embodiment (shown in FIG. 4C), and a process for forming nanocrystals 54 by heat treatment for crystallization (shown in FIGS. 4D, 4E) are continuously carried out without exposure to the air, under the following conditions:

(Pretreatment process)

Hydrofluoric acid HF: 1%

Time: 1 min.

(Process for forming crystal nuclei)

After once performing evacuation to $1 \times 10^{-9}$ Torr,

Temperature: 590° C.

Pressure: $1 \times 10^{-5}$ Torr

Disilane gas: 10 sccm

Time: 12 min.

(Heat treatment process for crystallization)

Temperature: 770° C.

Pressure: $1 \times 10^{-9}$ Torr

Time: 60 sec.

Figure 4E:
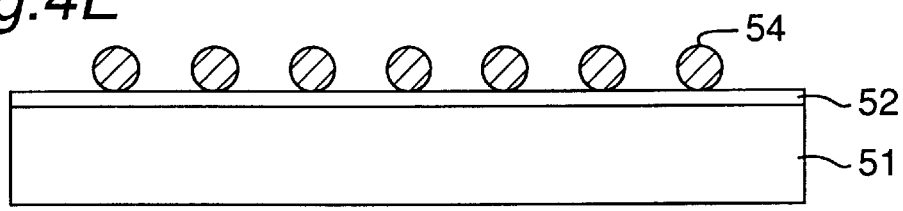

With these conditions, as shown in FIG. 4E, nanocrystals 54 having a diameter of 8 nm, a spacing of 6 nm and a center distance of 14 nm were formed. The crystal growth does not occur during the formation of the crystal nuclei 60 (during the irradiation of disilane gas), and the higher the temperature and the longer the irradiation time of disilane gas, the larger the density of the crystal nuclei. Further, the longer the heat treatment time for crystallization, the larger the crystal nuclei. That is, by optimizing the temperature and time for irradiation of disilane gas as well as the time for heat treatment, it is enabled to form desired nanocrystals.

Taking into consideration the controllability for the formation of crystal nuclei, a temperature range of 550–620° C. is desirable. Also, monosilane or trisilane gas may be irradiated instead of the disilane gas to form the crystal nuclei. In addition, pressures of 0.01 Torr or higher would cause island-shaped silicon grains to be formed, thus unsuitable.

Furthermore, the temperature for the heat treatment process for crystallization has only to be 550° C. or higher and be a temperature equal to or higher than the temperature for the formation of crystal nuclei.

In this second embodiment, the temperature for formation of crystal nuclei and the temperature for the succeeding heat treatment have been set the same for avoidance of the labor for changing the temperature after the formation of crystal nuclei. In the process for forming crystal nuclei, crystallization would not occur with 550° C. or lower temperatures. Besides, either the formation of nanocrystals or the formation of tunnel insulating film may come first in the sequence as in the first embodiment. However, when the tunnel insulating film is formed by oxidation, it is necessary to form the nanocrystals by taking into consideration the amount of oxidation of the surface of the nanocrystals during the oxidation process.

Figure 4F:
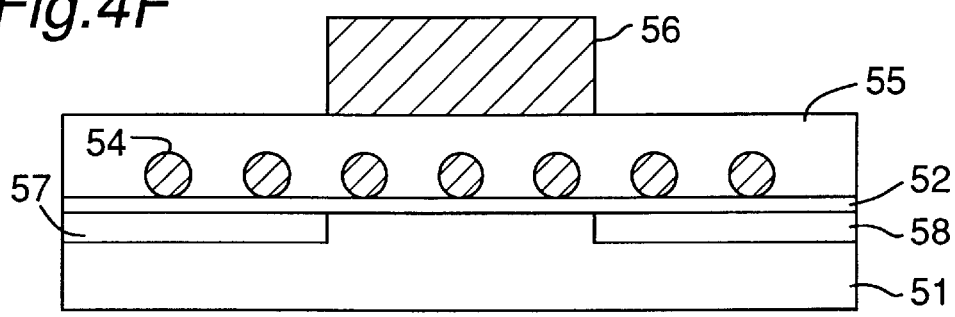
Figure 5:
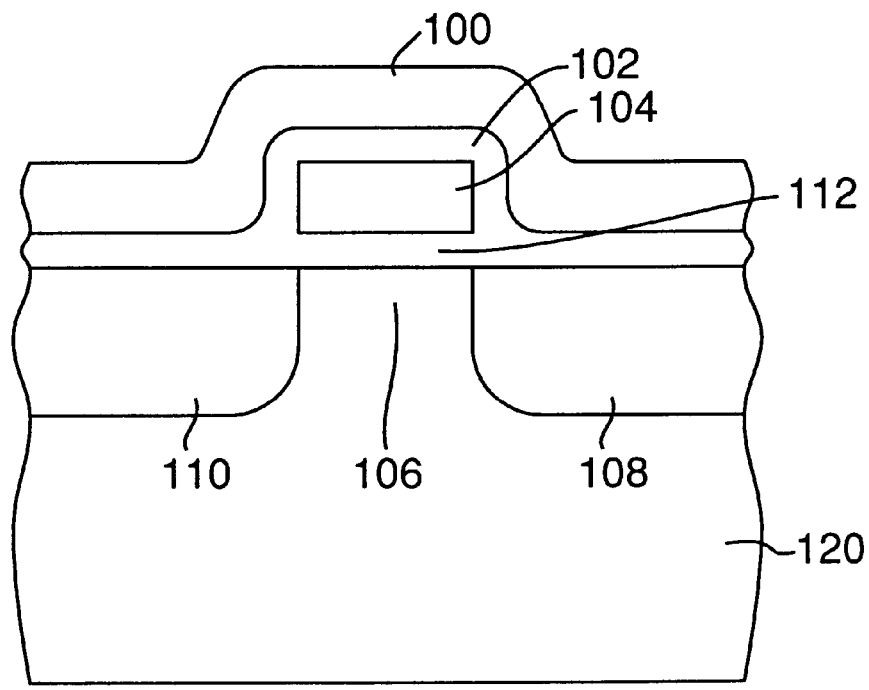
FIG. 5 is a sectional view of a semiconductor memory device according to the prior art.
Figure 6:
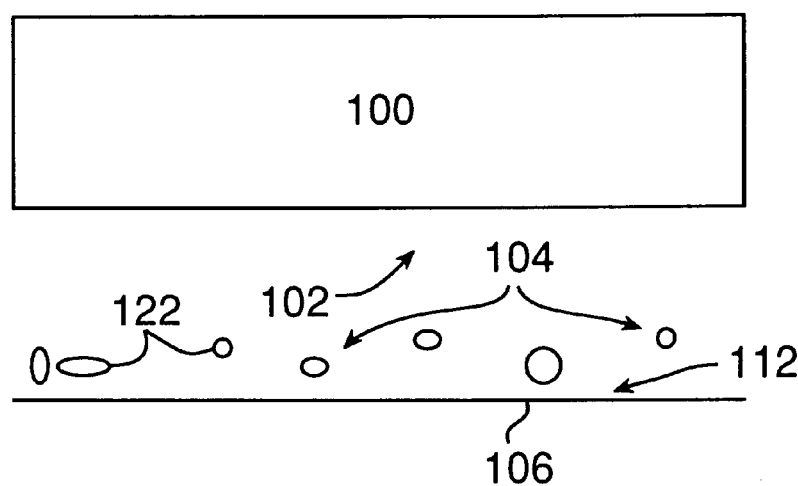
FIG. 6 is an enlarged view showing a floating gate of the semiconductor memory device.
Figure 7:
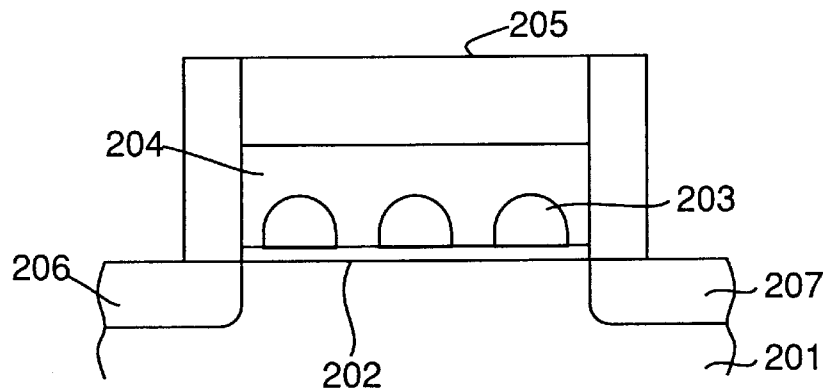
FIG. 7 is a schematic cross-sectional view of a semiconductor memory device having nanocrystals on the tunnel insulating film according to the prior art.
Figure 8A:
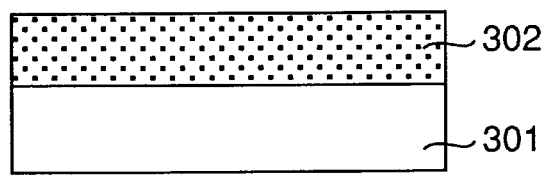
FIGS. 8A, 8B and 8C are process views showing the fabricating process of a semiconductor memory device having nanocrystals in a thermal oxide film according to the prior art.
Figure 8B:
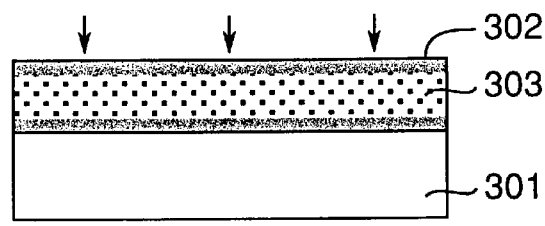
Figure 8C:
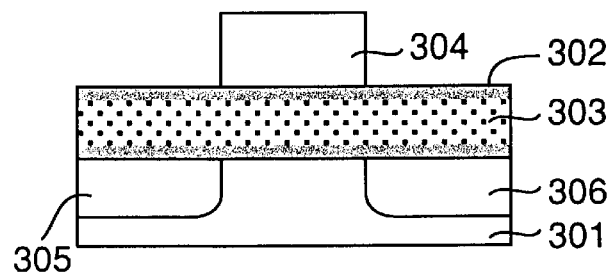

Next, as shown in FIG. 4F, a $SiO_2$ film is deposited by CVD process on the nanocrystals 54 and the tunnel insulating film 52, so that a control gate insulating film 55 is formed. Subsequently, a polysilicon region which results in a gate electrode 56 is fabricated. N-type impurities are doped to high concentration in this polysilicon region, making the region low resistance. After that, source and drain regions 57, 58 are formed on the silicon substrate 51.

This method for fabricating semiconductor nanocrystals has the same functions and effects as in the first embodiment. Further, after the deposition of an amorphous silicon thin film 53 on the tunnel insulating film 52 formed on the silicon substrate 51, crystal nuclei 60 are formed at the surface of the amorphous silicon thin film 53 and subsequently nanocrystals 54 are grown with the seeds of the crystal nuclei 60 at the surface of the amorphous silicon thin film 53 through heat treatment under a low pressure below atmospheric pressure. Therefore, the controllability for the size, shape, crystallinity and the like of the nanocrystals 54 can be enhanced so that variations in those characteristics can be further reduced. In this case, the density of crystal nuclei can be determined by the conditions under which the crystal nuclei are formed.

The method for fabricating semiconductor nanocrystals of this second embodiment has been described on a case of silicon Si nanocrystals. However, as in the first embodiment, germanium Ge nanocrystals can also be formed similarly.

For example, after an amorphous germanium film is deposited by the same process as in the first embodiment, the crystal nuclei of germanium Ge can be formed by the following processes:

(Pretreatment process)

Hydrofluoric acid HF: 1%

Time: 1 min.

(Process for forming crystal nuclei)

After once performing evacuation to $1\times10^{-9}$ Torr,

Temperature: 390° C.

Pressure: $1\times10^{-5}$ Torr

Monogermane $GeH_4$: 10 sccm

Time: 10 min.

Where, germanium tetrafluoride $GeF_4$ may also be used instead of monogermane $GeH_4$.

(Heat treatment process for crystallization)

Temperature: 750° C.

Pressure: $1\times10^{-9}$ Torr

Time: 60 sec.

Further, nanocrystals made from silicon Si and germanium Ge can be formed similarly. For example, after an amorphous silicon-germanium thin film is deposited by the same process as in the first embodiment, crystal nuclei comprising silicon Si and germanium Ge can be formed by the following processes:

(Pretreatment process)

Hydrofluoric acid HF: 1%

Time: 1 min.

(Process for forming crystal nuclei)

After once performing evacuation to $1\times10^{-9}$ Torr,

Temperature: 390° C.

Pressure: $1\times10^{-5}$ Torr

Monogermane $GeH_4$ disilane gas: 10 sccm

Time: 12 min.

Where, germanium tetrafluoride $GeF_4$ may be used instead of monogermane $GeH_4$, and silane or trisilane may be used instead of disilane.

(Heat treatment process for crystallization)

Temperature: 750° C.

Pressure: $1\times10^{-9}$ Torr

Time: 60 sec.

Further, whereas a silicon substrate has been used in the second embodiment, an SOI substrate may be used as in the first embodiment.

It is noted that the method for fabricating semiconductor nanocrystals and the semiconductor memory device according to the present invention are not limited to the constitutions of the first and second embodiments, and may be applied also to other devices which employ spherical semiconductor nanocrystals as storage nodes for carriers.

Furthermore, the first and second embodiments have been described on the methods for fabricating semiconductor nanocrystals which employ an amorphous silicon thin film, an amorphous germanium thin film and an amorphous silicon-germanium thin film as a noncrystalline semiconductor thin film. However, the noncrystalline semiconductor thin film is of course not limited to these ones.

According to a method for fabricating semiconductor nanocrystals of the present invention, a semiconductor nanocrystal which is highly controllable for density, size and the like and smaller in characteristic variations can be formed. Also, by making the diameter of the nanocrystal less than 18 nm, the lowest energy of the spherical semiconductor nanocrystal becomes larger than the energy at room temperature, so that the nanocrystal as a carrier confinement region can retain electrons for enough long time at room temperature without being affected by thermal fluctuation. Also, a spherical semiconductor nanocrystal on the order of nm size that can be applied to single electron transistors or single electron memories can be realized. With the use of this semiconductor nanocrystal, a semiconductor memory device which does not require the cooling to cryogenic temperatures and which is enabled to store information at room temperature and further which is smaller in characteristic variations can be provided. Furthermore, with the use of this semiconductor memory device, an information storage unit (memory) can be implemented with smaller numbers of elements and smaller area, while a fast reprogrammable, nonvolatile semiconductor memory can be realized.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating semiconductor nanocrystals comprising:

a step for depositing a noncrystal semiconductor thin film on a semiconductor substrate, or on an insulating film formed on the semiconductor substrate, under a low pressure below atmospheric pressure; and a step for, after the deposition of the noncrystal semiconductor thin film, heat treating the noncrystal semiconductor thin film at a temperature not lower than a deposition temperature of the noncrystal semiconductor thin film in a vacuum or in an atmosphere of a gas having no oxidizability, by which a plurality of spherical semiconductor nanocrystals with a diameter of 18 nm or less are formed on the semiconductor substrate or on the insulating film so as to be spaced from one another.

2. The method for fabricating semiconductor nanocrystals according to claim 1, wherein after the deposition of the noncrystal semiconductor thin film, the semiconductor nanocrystals are formed without exposing the noncrystal semiconductor thin film to the air.

3. The method for fabricating semiconductor nanocrystals according to claim 1, further comprising a step for, after the deposition of the noncrystal semiconductor thin film, removing an oxide film from a surface of the noncrystal semiconductor thin film at a temperature not higher than the deposition temperature of the noncrystal semiconductor thin film before forming the semiconductor nanocrystals.

4. The method for fabricating semiconductor nanocrystals according to claim 1, further comprising a step for, after the deposition of the noncrystal semiconductor thin film, forming crystal nuclei at the surface of the noncrystal semiconductor thin film at a low pressure below atmospheric pressure before forming the semiconductor nanocrystals.

5. The method for fabricating semiconductor nanocrystals according to claim 4, wherein:

the semiconductor nanocrystals are made from silicon; and the step for forming the crystal nuclei is carried out in a 0.01 Torr or lower vacuum by using a gas containing any one of silane gas, disilane gas or trisilane gas as a material gas.

6. The method for fabricating semiconductor nanocrystals according to claim 4, wherein:

the semiconductor nanocrystals are made from germanium; and the step for forming the crystal nuclei is carried out in a 0.01 Torr or lower vacuum by using a gas containing either one of germanium tetrafluoride or monogermane as a material gas.

7. The method for fabricating semiconductor nanocrystals according to claim 4, wherein:

the semiconductor nanocrystals are made from silicon and germanium; and the step for forming the crystal nuclei is carried out in a 0.01 Torr or lower vacuum by using a gas containing any one of silane gas, disilane gas or trisilane gas and either one of germanium tetrafluoride or monogermane as a material gas.

8. The method for fabricating semiconductor nanocrystals according to claim 1, further comprising a step for, after the noncrystal semiconductor thin film is deposited on the semiconductor substrate and the semiconductor nanocrystals are formed, oxidizing the surface of the semiconductor nanocrystals and the surface of the semiconductor substrate, thereby forming an oxide film.

9. The method for fabricating semiconductor nanocrystals according to claim 1, wherein a deposition thickness "t" of the noncrystal semiconductor thin film and a center distance "s" of adjacent semiconductor nanocrystals satisfy a relationship that $t<(\pi/6)s$.

10. The method for fabricating semiconductor nanocrystals according to claim 1, wherein the semiconductor nanocrystals are made from any one of silicon, germanium or a mixture of silicon and germanium.

11. The method for fabricating semiconductor nanocrystals according to claim 10, wherein:

the semiconductor nanocrystals are made from silicon;

in the step for forming the noncrystal semiconductor thin film, an amorphous silicon thin film is deposited by using any one of silane gas, disilane gas or trisilane gas as a material gas, or by using a mixed gas of any one of silane gas, disilane gas or trisilane gas and a gas having no oxidizability as a material gas; and in the step for forming the semiconductor nanocrystals, the semiconductor nanocrystals are grown in a 10 Torr or lower vacuum or in a 10 Torr or lower atmosphere of a gas having no oxidizability.

12. The method for fabricating semiconductor nanocrystals according to claim 10, wherein:

the semiconductor nanocrystals are made from germanium;

in the step for forming the noncrystal semiconductor thin film, an amorphous germanium thin film is deposited by using any one of germanium tetrafluoride or monogermane as a material gas, or by using a mixed gas of either one of germanium tetrafluoride or monogermane and a gas having no oxidizability as a material gas; and in the step for forming the semiconductor nanocrystals, the semiconductor nanocrystals are grown in a 10 Torr or lower vacuum or in a 10 Torr or lower atmosphere of a gas having no oxidizability.

13. The method for fabricating semiconductor nanocrystals according to claim 10, wherein the semiconductor nanocrystals are made from silicon and germanium;

in the step for forming the noncrystal semiconductor thin film, an amorphous silicon-germanium thin film is deposited by using any one of silane gas, disilane gas or trisilane gas and either one of germanium tetrafluoride or monogermane as a material gas, or by using a mixed gas of any one of silane gas, disilane gas or trisilane gas, either one of germanium tetrafluoride or monogermane and a gas having no oxidizability as a material gas; and in the step for forming the semiconductor nanocrystals, the semiconductor nanocrystals are grown in a 10 Torr or lower vacuum or in a 10 Torr or lower atmosphere a gas having no oxidizability.

* * * * *